United States Patent
Ikeda

(10) Patent No.: US 9,142,544 B2
(45) Date of Patent: Sep. 22, 2015

(54) SEMICONDUCTOR DEVICE

(71) Applicant: Kabushiki Kaisha Toshiba, Minato-ku (JP)

(72) Inventor: Kentaro Ikeda, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/183,737

(22) Filed: Feb. 19, 2014

(65) Prior Publication Data

US 2014/0284662 A1    Sep. 25, 2014

(30) Foreign Application Priority Data

Mar. 21, 2013   (JP) .................................. 2013-058839

(51) Int. Cl.

| H01L 29/778 | (2006.01) |
|---|---|
| H01L 27/02 | (2006.01) |
| H01L 25/18 | (2006.01) |
| H03K 17/0814 | (2006.01) |
| H03K 17/12 | (2006.01) |

(52) U.S. Cl.
CPC ............. *H01L 27/0255* (2013.01); *H01L 25/18* (2013.01); *H03K 17/08148* (2013.01); *H03K 17/12* (2013.01); *H03K 17/127* (2013.01); *H01L 2224/48091* (2013.01); *H01L 2224/48247* (2013.01); *H01L 2224/48464* (2013.01); *H01L 2924/12032* (2013.01); *H01L 2924/13091* (2013.01); *H01L 2924/19105* (2013.01); *H01L 2924/19107* (2013.01)

(58) Field of Classification Search
CPC ............ H01L 27/0255; H01L 27/0605; H01L 29/66462
USPC ........................... 257/195, 196, 200, E29.246
See application file for complete search history.

(56) References Cited

U.S. PATENT DOCUMENTS

| 8,847,235 B2 | 9/2014 | Rose | |
|---|---|---|---|
| 2011/0199148 A1* | 8/2011 | Iwamura | ....................... 327/430 |
| 2012/0241756 A1 | 9/2012 | Zhang et al. | |

FOREIGN PATENT DOCUMENTS

| EP | 2693639 A1 | 2/2014 |
|---|---|---|
| JP | 2012-212875 | 11/2012 |

* cited by examiner

*Primary Examiner* — Minchul Yang
(74) *Attorney, Agent, or Firm* — Oblon, McClelland, Maier & Neustadt, L.L.P.

(57) ABSTRACT

A semiconductor device of an embodiment includes a normally-off transistor having a first source electrically connected to a source terminal, a first drain, and a first gate electrically connected to a gate terminal, a normally-on transistor having a second source electrically connected to the first drain, a second drain electrically connected to a drain terminal, and a second gate, a capacitor having one end electrically connected to the gate terminal and the other end electrically connected to the second gate; and a first diode having a first anode electrically connected to the capacitor and the second gate and a first cathode electrically connected to the first source.

11 Claims, 9 Drawing Sheets

SEMICONDUCTOR DEVICE

CROSS-REFERENCE TO RELATED APPLICATION

This application is based upon and claims the benefit of priority from Japanese Patent Application No. 2013-058839, filed on Mar. 21, 2013, the entire contents of which are incorporated herein by reference.

FIELD

Embodiments described herein relate generally to a semiconductor device.

BACKGROUND

A group-III nitride semiconductor such as a GaN (gallium nitride)-based semiconductor is expected as a material of a next-generation power semiconductor device. A GaN-based semiconductor device has a band gap wider than that of a Si (silicon) semiconductor device and high withstand voltage and low loss than those of the Si semiconductor device may be realized.

A HEMT (high electron mobility transistor) structure using two-dimensional electron gas (2DEG) as a carrier is applied in general to a GaN-based transistor. A normal HEMT is a normally-on transistor conducting even when a voltage is not applied to a gate. Therefore, there is a problem that it is difficult to realize a normally-off transistor conducting only when the voltage is applied to the gate.

In a power source circuit and the like handling a large amount of power of several hundreds to one thousand volts, normally-off operation is required with emphasis on safety. Therefore, a circuit configuration to realize the normally-off operation by cascode connection of a normally-on GaN-based transistor and a normally-off Si transistor is proposed.

However, in such circuit configuration, there is a problem of a break-down and deterioration in property of a device when an overvoltage is generated at a connection of the two transistors.

DETAILED DESCRIPTION

Figure 1:
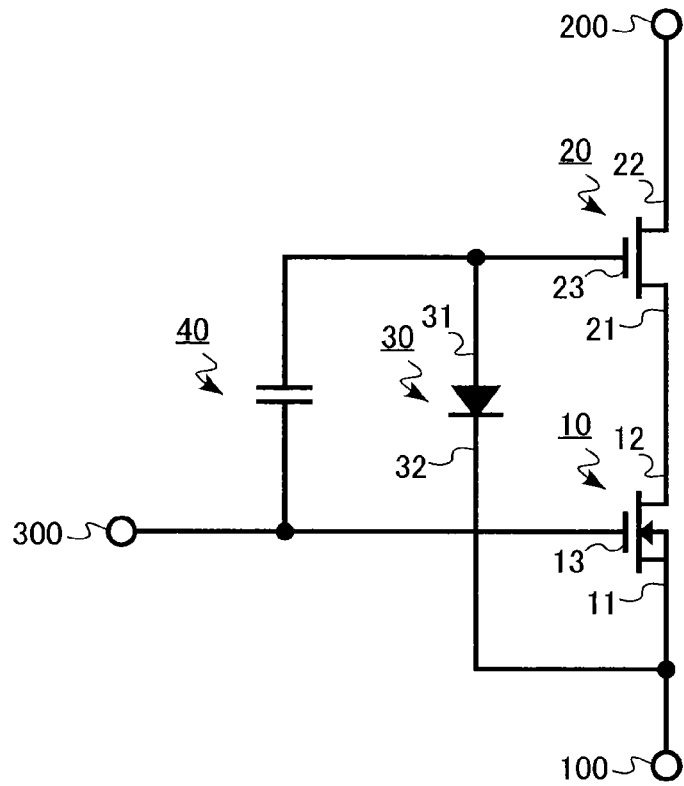
FIG. 1 is a circuit diagram of a semiconductor device of a first embodiment.

A semiconductor device of an embodiment includes a normally-off transistor having a first source electrically connected to a source terminal, a first drain, and a first gate electrically connected to a gate terminal, a normally-on transistor having a second source electrically connected to the first drain, a second drain electrically connected to a drain terminal, and a second gate, a capacitor having one end electrically connected to the gate terminal and the other end electrically connected to the second gate; and a first diode having a first anode electrically connected to the capacitor and the second gate and a first cathode electrically connected to the first source.

Hereinafter, embodiments of the disclosure are described with reference to the drawings. Meanwhile, in the following description, the same reference numeral is assigned to the same member and the like and the description of the member and the like once described is appropriately omitted.

In this specification, the semiconductor device is a concept including a power module in which a plurality of devices such as a discrete semiconductor are combined, an intelligent power module in which a driver circuit which drives the devices and a self-protection function are incorporated in a plurality of devices such as the discrete semiconductor, or an entire system provided with the power module and the intelligent power module.

First Embodiment

A semiconductor device of this embodiment is provided with a source terminal, a drain terminal, and a gate terminal. This is provided with a normally-off transistor including a first source electrically connected to the source terminal, a first drain, and a first gate electrically connected to the gate terminal, a normally-on transistor including a second source electrically connected to the first drain, a second drain electrically connected to the drain terminal, and a second gate, a capacitor provided between the gate terminal and the second gate, and a first diode including a first anode electrically connected between the capacitor and the second gate and a first cathode electrically connected to the first source.

FIG. 1 is a circuit diagram of the semiconductor device of this embodiment. The semiconductor device of this embodiment is a power module having a rated voltage of 600 V or 1200 V, for example.

In the semiconductor device of this embodiment, a normally-off transistor 10 and a normally-on transistor 20 are electrically connected in series to form the power module. The normally-off transistor 10 is a Si (silicon)-vertical MOSFET (metal oxide semiconductor field effect transistor), for example. The normally-on transistor 20 is a GaN (gallium nitride)-based HEMT, for example. The normally-on transistor 20 is provided with a gate insulation film.

Meanwhile, the normally-off transistor 10 includes a parasitic body diode not illustrated.

The normally-off transistor 10 has a device withstand voltage lower than that of the normally-on transistor 20. The device withstand voltage of the normally-off transistor 10 is 10 to 30 V, for example. The device withstand voltage of the normally-on transistor 20 is 600 to 1200 V, for example.

The semiconductor device is provided with a source terminal 100, a drain terminal 200, and a gate terminal 300. The normally-off transistor 10 includes a first source 11 electrically connected to the source terminal 100, a first drain 12, and a first gate 13 electrically connected to the gate terminal 300. The normally-on transistor 20 includes a second source 21 electrically connected to the first drain 12, a second drain 22 electrically connected to the drain terminal 200, and a second gate 23.

The semiconductor device is provided with a capacitor 40 provided between the gate terminal 300 and the second gate 23. This is also provided with a first diode 30 including a first anode 31 electrically connected between the capacitor 40 and the second gate 23 and a first cathode 32 electrically connected to the first source 11. The first diode 30 is a PiN diode or a Schottky barrier diode, for example.

The semiconductor device of this embodiment serves as a normally-off transistor provided with the source terminal 100, the drain terminal 200, and the gate terminal 300 by the above-described configuration. Hereinafter, operation of the semiconductor device of this embodiment is described.

First, in an on-state, a voltage of 0 V is applied to the source terminal 100 and a positive voltage, for example, a product of an on-resistance and a drain current is applied to the drain terminal 200. A positive voltage, for example, 10 V is applied to the gate terminal 300.

At that time, a positive voltage is applied to the first gate 13 of the normally-off transistor 10. Therefore, the normally-off transistor 10 is turned on.

On the other hand, the second gate 23 of the normally-on transistor 20 is clamped to the source terminal 100 through the first diode 30. Therefore, the second gate 23 has a positive voltage near 0 V, more precisely, a forward drop voltage (Vf) of the first diode 30. Since the normally-off transistor 10 is turned on, the second source 21 has potential near 0 V. Therefore, the normally-on transistor 20 is also turned on. Therefore, an on-state current flows between the source terminal 100 and the drain terminal 200.

Next, a case in which the semiconductor device is turned off from the on-state is considered. In this case, the voltages applied to the source terminal 100 and the drain terminal 200 do not change but the voltage applied to the gate terminal 300 drops from the positive voltage to 0 V, for example, from 10 V to 0 V.

First, a voltage of 0 V is applied to the first gate 13 of the normally-off transistor 10. Therefore, the normally-off transistor 10 is turned off.

On the other hand, since there is the capacitor 40, potential of the second gate 23 of the normally-on transistor 20 decreases by an amount of amplitude of the gate terminal 300. For example, it decreases by the amount of amplitude of the gate terminal 300, for example, 10 V from the forward drop voltage (Vf) of the first diode 30 and negative potential of (Vf−10) V is obtained. Then, the voltage of the second gate 23 becomes equal to or lower than a threshold of the normally-on transistor 20 and the normally-on transistor 20 is turned off. Therefore, the current between the source terminal 100 and the drain terminal 200 is interrupted.

The semiconductor device of this embodiment serves as the normally-off transistor provided with the source terminal 100, the drain terminal 200, and the gate terminal 300 as described above.

Meanwhile, the semiconductor device of this embodiment is configured such that the normally-on transistor 20 is turned off before the normally-off transistor 10 when this shifts from the on-state to the off-state. Since the normally-on transistor 20 is turned off first, generation of an overvoltage between the normally-off transistor 10 and the normally-on transistor 20, that is to say, the first drain 12 and the second source 21 (hereinafter, also referred to as a connection) is inhibited.

This is because, when the normally-on transistor 20 is turned off first, it is possible to release a charge to the source terminal 100 by the normally-off transistor 10 which is turned on even when the potential at the connection increases by a transient current.

Figure 2:
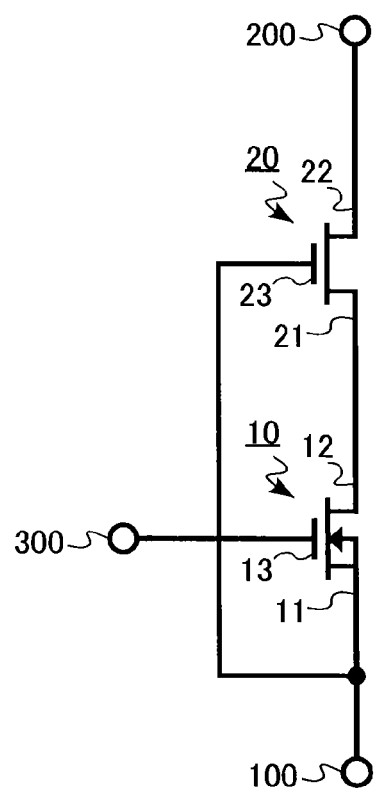
FIG. 2 is a circuit diagram of a semiconductor device of a comparative embodiment.

FIG. 2 is a circuit diagram of a semiconductor device of a comparative embodiment. The semiconductor device of the comparative embodiment has a circuit configuration in which a normally-off transistor 10 and a normally-on transistor 20 are cascode connected. The normally-off transistor 10 and the normally-on transistor 20 are similar to those of the embodiment.

The semiconductor device is provided with a source terminal 100, a drain terminal 200, and a gate terminal 300. The normally-off transistor 10 includes a first source 11 electrically connected to the source terminal 100, a first drain 12, and a first gate 13 electrically connected to the gate terminal 300. The normally-on transistor 20 includes a second source 21 electrically connected to the first drain 12, a second drain 22 electrically connected to the drain terminal 200, and a second gate 23 electrically connected to the source terminal 100.

The semiconductor device of the comparative embodiment also serves as a normally-off transistor provided with the source terminal 100, the drain terminal 200, and the gate terminal 300 by the above-described configuration.

In the circuit configuration of the comparative embodiment, an overvoltage might be generated during device operation at a connection between the normally-off transistor 10 and the normally-on transistor 20, that is to say, the first drain 12 of the normally-off transistor 10 or the second source 21 of the normally-on transistor 20. For example, when a transient current is generated when the semiconductor device shifts from an on-state to an off-state and a high voltage applied between the source terminal 100 and the drain terminal 200 is divided at a parasitic capacitance ratio between the normally-off transistor 10 and the normally-on transistor 20, the overvoltage might be generated.

In the comparative embodiment, when it shifts from the on-state to the off-state, the normally-off transistor 10 is turned off first, then a voltage at the connection increases, and when potential difference between the second gate 23 clamped at 0 V and the second source 21 reaches a threshold, the normally-on transistor 20 is turned off. Therefore, when potential at the connection increases by the transient current, there is no pathway to release a charge, so that the overvoltage is generated at the connection.

When the overvoltage is generated, a high voltage is applied between the second source 21 and the second gate 23 of the normally-on transistor 20. When the high voltage becomes equal to or higher than a withstand voltage of a gate insulation film, a leakage current of the gate insulation film of the normally-on transistor 20 might increase or the gate insulation film might be broken. When the leakage current of the gate insulation film of the normally-on transistor 20 increases or when the gate insulation film is broken, this brings operation failure of the semiconductor device. Therefore, reliability of the semiconductor device is deteriorated.

Even when the gate insulation film does not have a problem, since the high voltage is applied between the second source 21 and the second gate 23 of the normally-on transistor 20, the charge is trapped on a side of the second source 21. According to this, a current collapse might occur. When the current collapse occurs, an on-state current decreases and the operation failure arises. Therefore, the reliability of the semiconductor device is also deteriorated.

In this embodiment, it is possible to release the charge to the source terminal 100 by the normally-off transistor 10 which is turned on even when the potential at the connection increases by the transient current as described above. Therefore, the overvoltage at the connection is not generated in principle. Therefore, an increase in the leakage current of the gate insulation film of the normally-on transistor 20 and a break of the gate insulation film are prevented. The current collapse is also prevented. Therefore, the reliability of the semiconductor device is improved.

Figure 3:
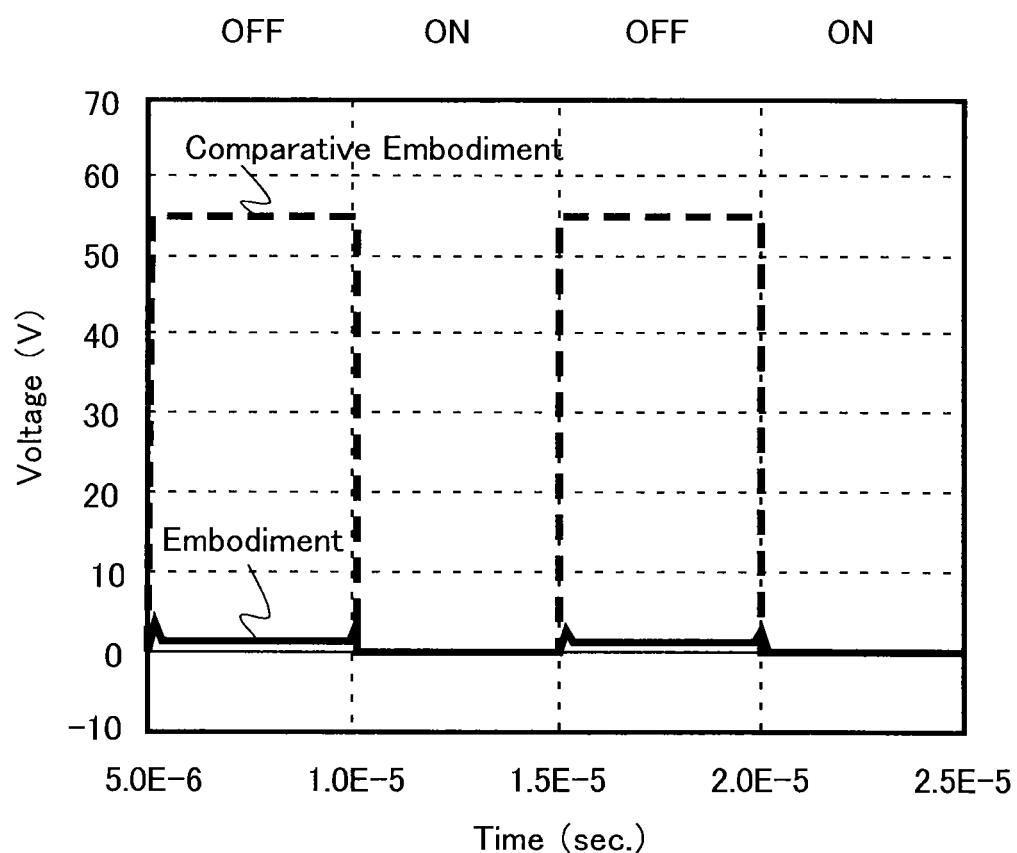
FIG. 3 is a view illustrating an effect of the semiconductor device of the first embodiment.

FIG. 3 is a view illustrating an effect of the semiconductor device of this embodiment. A simulation result of change in voltage at the connection when on-off operation is repeated in the circuit of this embodiment and that of the comparative embodiment is illustrated.

A solid line indicates a case of the embodiment and a dotted line indicates a case of the comparative embodiment. It is understood that, although a high overvoltage is generated at the connection at the time of turn-off in the comparative embodiment, the overvoltage is effectively inhibited in the embodiment.

In this embodiment, the voltage is not directly applied to the second gate 23 of the normally-on transistor 20 in the turn-off state of the semiconductor device. Therefore, the voltage of the second gate 23 might gradually increase from a negative voltage to 0 V by a gate leakage current, the leakage current of the diode 30 and the like.

When the voltage of the second gate 23 increases, the leakage current between the second source 21 and the second drain of the normally-on transistor 20 also increases. The normally-off transistor 10 remains turned off, so that the voltage of the second source 21 (first drain 12, connection) increases. Then, the potential difference between the second source 21 and the second gate becomes larger and the normally-on transistor 20 is turned off, and the leakage current between the second source 21 and the second drain is interrupted. Therefore, the turn-off state of the semiconductor device is maintained.

In this embodiment, sheet resistance of the normally-on transistor 20 is desirably lower than sheet resistance of a gate electrode material of the normally-off transistor 10. This is because a configuration in which the normally-on transistor 20 is turned off before the normally-off transistor 10 when it shifts from the on-state to the off-state becomes easier.

A configuration in which the normally-off transistor 10 is turned on before the normally-on transistor 20 is desirable when it shifts from the off-state to the on-state. This is because, if the normally-on transistor 20 is turned on first, a high voltage might be applied to the first drain 12 (second source 21, connection) and property of the normally-off transistor 10 might be deteriorated.

A capacitance of the capacitor 40 is desirably 10 times or more and 100 times or less as large as an input capacitance of the normally-on transistor 20. A negative voltage applied to the second gate 23 of the normally-on transistor 20 is determined by a ratio between the capacitance of the capacitor 40 and the input capacitance of the normally-on transistor 20. Therefore, the capacitance of the capacitor 40 is desirably larger.

When the capacitance of the capacitor 40 is 10 times or more as large as the input capacitance of the normally-on transistor 20, it is possible to apply 90% or more of the amplitude applied to the gate terminal 300. If the former is more than 100 times as large as the latter, the capacitor becomes too large and there is concern about an increase in size of the semiconductor device.

Meanwhile, the input capacitance of the normally-on transistor 20 is the capacitance between the second gate 23, and the second source 21 and the second drain 22. The input capacitance is a value in a pinch-off state and when a bias between the second source 21 and the second drain 22 is 0 V.

Different from the comparative embodiment, especially, a switching speed from the on-state to the off-state is defined by the normally-on transistor 20 being a GaN-based HEMT with a high switching speed in this embodiment. Therefore, the semiconductor device with the high switching speed may be realized.

An avalanche breakdown voltage of the normally-off transistor 10 is desirably made lower than the withstand voltage of the gate insulation film of the normally-on transistor 20. According to this, a withstand voltage between the first source and the first drain when the normally-off transistor is turned off is made lower than a withstand voltage between the second source and the second gate of the normally-on transistor.

By doing so, even when the overvoltage is generated at the connection by a surge and the like, for example, an avalanche breakdown of the normally-off transistor 10 occurs and it becomes possible to release the charge at the connection. Therefore, it becomes possible to make the voltage applied between the second source 21 and the second gate 23 of the normally-on transistor 20 lower than the withstand voltage of the gate insulation film of the normally-on transistor 20. Therefore, the increase in the leakage current of the gate insulation film of the normally-on transistor 20 and the break of the gate insulation film are prevented. The current collapse is also prevented. Therefore, the reliability of the semiconductor device is improved.

Meanwhile, the withstand voltage of the gate insulation film of the normally-on transistor 20 is higher than 30 V in general. Therefore, the avalanche breakdown voltage of the normally-off transistor 10 is desirably not higher than 30 V.

The avalanche breakdown voltage is desirably sufficiently higher than an absolute value of a threshold (Vth) of the normally-on transistor 20. This is for surely turning off the normally-on transistor 20. From this point of view, the avalanche breakdown voltage of the normally-off transistor 10 is desirably equal to or higher than an absolute value of the threshold (Vth) of the normally-on transistor 20+5 V. If Vth=−10 V is satisfied, the avalanche breakdown voltage of the normally-off transistor 10 is desirably not lower than 15 V.

Second Embodiment

A semiconductor device of this embodiment is similar to that of the first embodiment except that a plurality of first diodes is electrically connected in series. Therefore, the description of contents overlapped with those of the first embodiment is not repeated.

Figure 4:
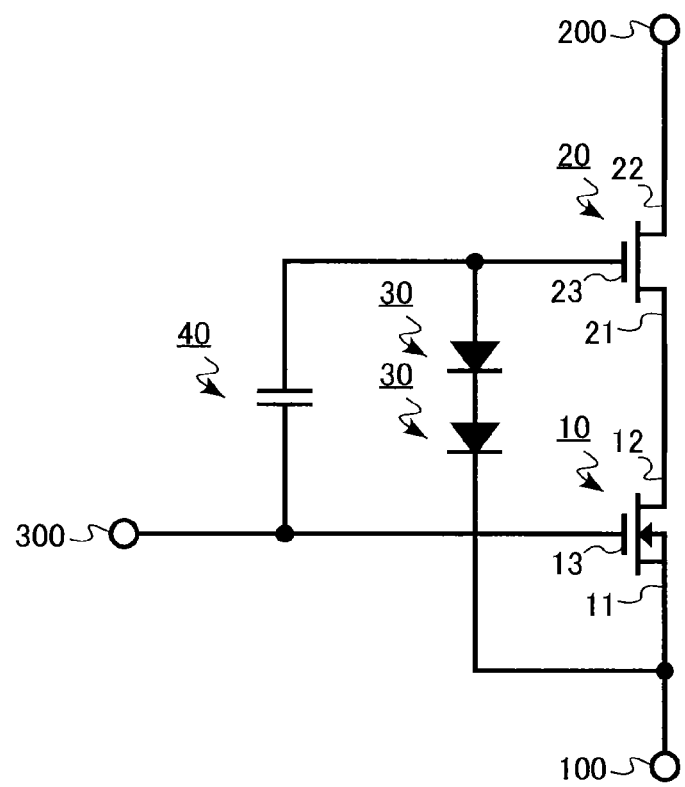
FIG. 4 is a circuit diagram of a semiconductor device of a second embodiment.

FIG. 4 is a circuit diagram of the semiconductor device of this embodiment. In the semiconductor device of this embodiment, two first diodes 30 are connected in series.

According to this embodiment, a voltage of a forward drop voltage (Vf) of the first diode 30×2 is applied to a second gate 23 in an on-state of the semiconductor device. Therefore, overdrive of a normally-on transistor 20 becomes possible and an on-state current may be increased.

Even when a voltage of a second source 21 is increased by an amount of drain current×on-resistance of the normally-off transistor 10 in the on-state of the semiconductor device, since the voltage of the forward drop voltage (Vf) of the first diode 30×2 is applied to the second gate 23, conduction loss may be inhibited.

Meanwhile, a case in which the two first diodes 30 are electrically connected in series is herein described as an example, the number of the first diodes 30 electrically connected in series may be three or more. When the number is n (n is an integral number not smaller than two), a voltage of the forward drop voltage (Vf) of the first diode 30×n is applied to the second gate 23.

According to this embodiment, in addition to the effect of the first embodiment, it becomes possible to realize an increase in the on-state current or a decrease in the conduction loss.

Third Embodiment

A semiconductor device of this embodiment is similar to that of the first embodiment except that a first resistive element one end of which is electrically connected between a gate terminal and a capacitor and the other end of which is electrically connected to a first gate is further provided. Therefore, the description of contents overlapped with those of the first embodiment is not repeated.

Figure 5:
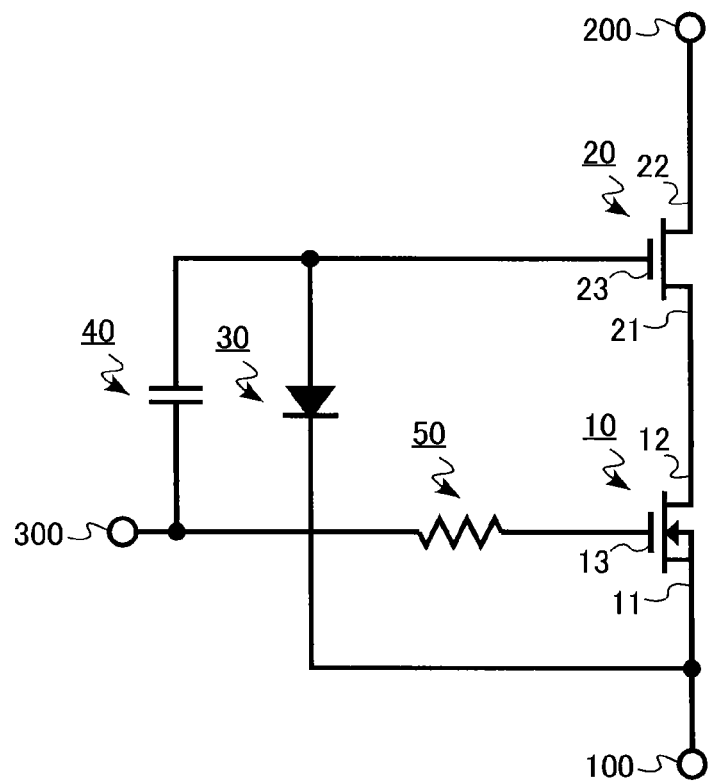
FIG. 5 is a circuit diagram of a semiconductor device of a third embodiment.

FIG. 5 is a circuit diagram of the semiconductor device of this embodiment.

The semiconductor device of this embodiment is provided with a first resistive element 50 one end of which is electrically connected between a gate terminal 300 and a capacitor 40 and the other end of which is electrically connected to a first gate 13.

From a viewpoint of inhibiting an overvoltage at a connection, a normally-on transistor 20 is turned off before a normally-off transistor 10 when it shifts from an on-state to an off-state. It is possible to delay off timing of the normally-off transistor 10 and off timing of the normally-on transistor 20 by desired time by providing the first resistive element 50.

Resistance of the first resistive element 50 is desirably not lower than 1Ω and not higher than 100Ω. Under this range, significant delay time might not be realized. Above this range, delay time becomes too long and a switching speed of the semiconductor device is undesirably decreased.

According to this embodiment, in addition to the effect of the first embodiment, stable operation may be realized by adjusting the off timing of the normally-off transistor 10 and that of the normally-on transistor 20.

Fourth Embodiment

A semiconductor device of this embodiment is similar to that of the third embodiment except that a second diode including a second anode electrically connected to a gate terminal and a second cathode electrically connected to a first gate provided between the gate terminal and the first gate in parallel with a first resistive element is further provided. Therefore, the description of contents overlapped with those of the first and third embodiments is not repeated.

Figure 6:
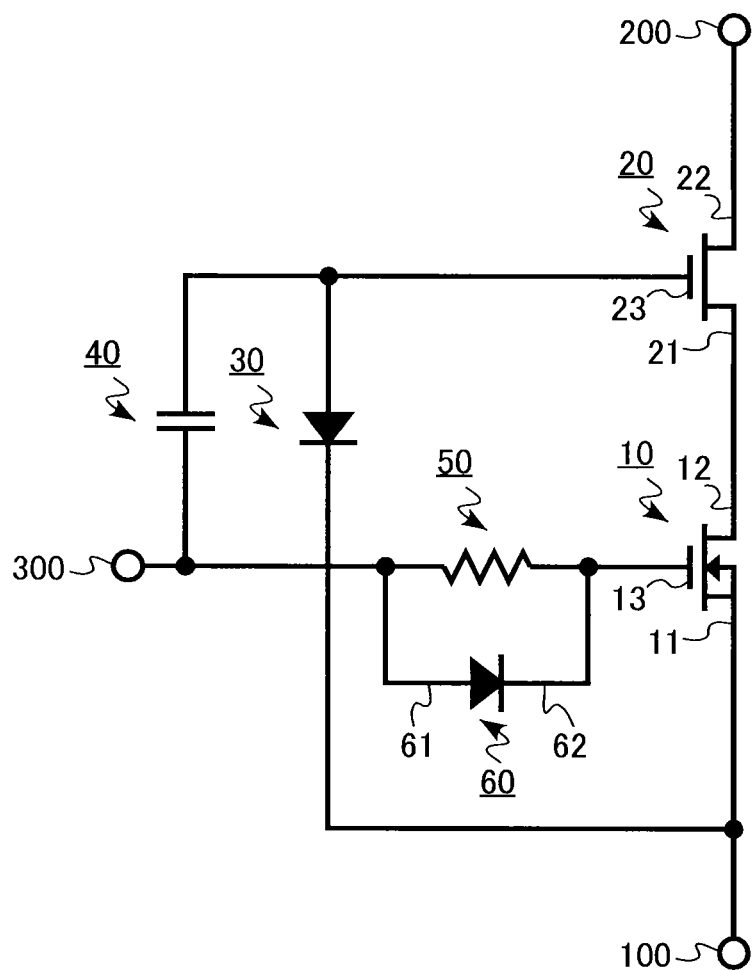
FIG. 6 is a circuit diagram of a semiconductor device of a fourth embodiment.

FIG. 6 is a circuit diagram of the semiconductor device of this embodiment.

In the semiconductor device of this embodiment, a second diode 60 is provided between a gate terminal 300 and a first gate 13 in parallel with a first resistive element 50. A second anode 61 of the second diode 60 is electrically connected to the gate terminal 300 and a second cathode 62 is electrically connected to a first gate 13. The second diode 60 is a PiN diode or a Schottky barrier diode, for example.

It is desirable that a normally-off transistor 10 is turned on before a normally-on transistor 20 when it shifts from an off-state to an on-state. This is because, if the normally-on transistor 20 is turned on first, a high voltage might be applied to a first drain 12 (second source 21, connection) and a property of the normally-off transistor 10 might be deteriorated.

According to this embodiment, when it shifts from the off-state to the on-state, a current flows through the second diode 60. Therefore, the first gate 13 may be rapidly charged without an effect of the first resistive element 50. Therefore, on-timing of the normally-off transistor 10 is earlier than that in a case without the second diode 60. Therefore, it becomes possible to surely turn on the normally-off transistor 10 before the normally-on transistor 20 when it shifts from the off-state to the on-state.

According to this embodiment, in addition to the effect of the third embodiment, protection to the normally-off transistor 10 is reinforced and reliability is further improved.

Fifth Embodiment

A semiconductor device of this embodiment is similar to that of the fourth embodiment except that a second resistive element having one end electrically connected to the gate terminal and the other end electrically connected to the capacitor and the first gate is further provided. Therefore, the description of contents overlapped with those of the fourth embodiment is not repeated.

Figure 7:
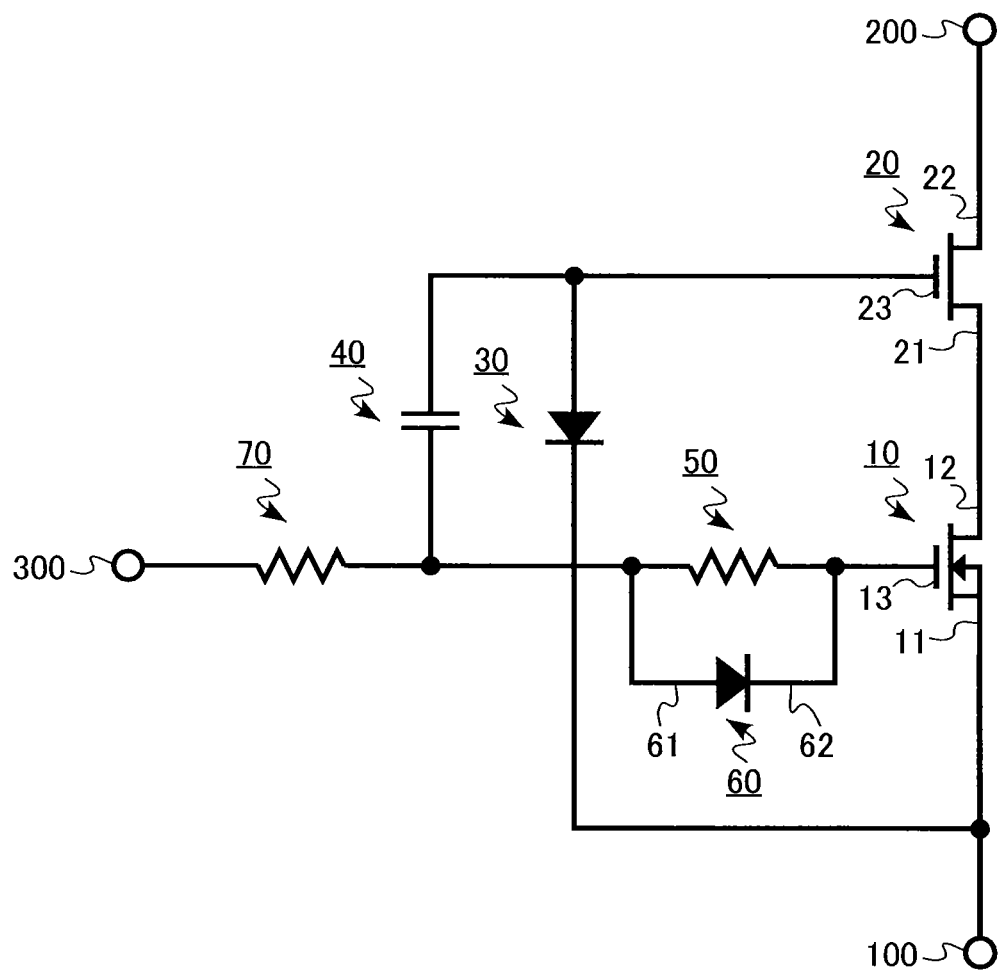
FIG. 7 is a circuit diagram of a semiconductor device of a fifth embodiment.

FIG. 7 is a circuit diagram of the semiconductor device of this embodiment.

The semiconductor device of this embodiment is provided with a second resistive element 70 provided between a gate terminal 300, and a capacitor 40 and a first gate 13.

In a power electronics circuit design, there is a case in which an operation speed of a transistor is required to be adjusted as measures against noise. In this embodiment, it is possible to delay propagation of a gate voltage applied to the gate terminal 300 to the first gate 13 and a second gate 23 by providing the second resistive element 70. Therefore, it becomes possible to adjust the operation speed (switching speed) of the semiconductor device.

Meanwhile, although the circuit provided with a first resistive element 50 and a second diode 60 is herein described as an example, a circuit configuration without the first resistive element 50 and the second diode 60 is also possible.

According to this embodiment, in addition to the effect of the fourth embodiment, it becomes possible to adjust the operation speed (switching speed) of the semiconductor device.

Sixth Embodiment

A semiconductor device of this embodiment is similar to that of the fourth embodiment except that a third resistive element provided between a capacitor and a second gate is further provided. Therefore, the description of contents overlapped with those of the fourth embodiment is not repeated.

Figure 8:
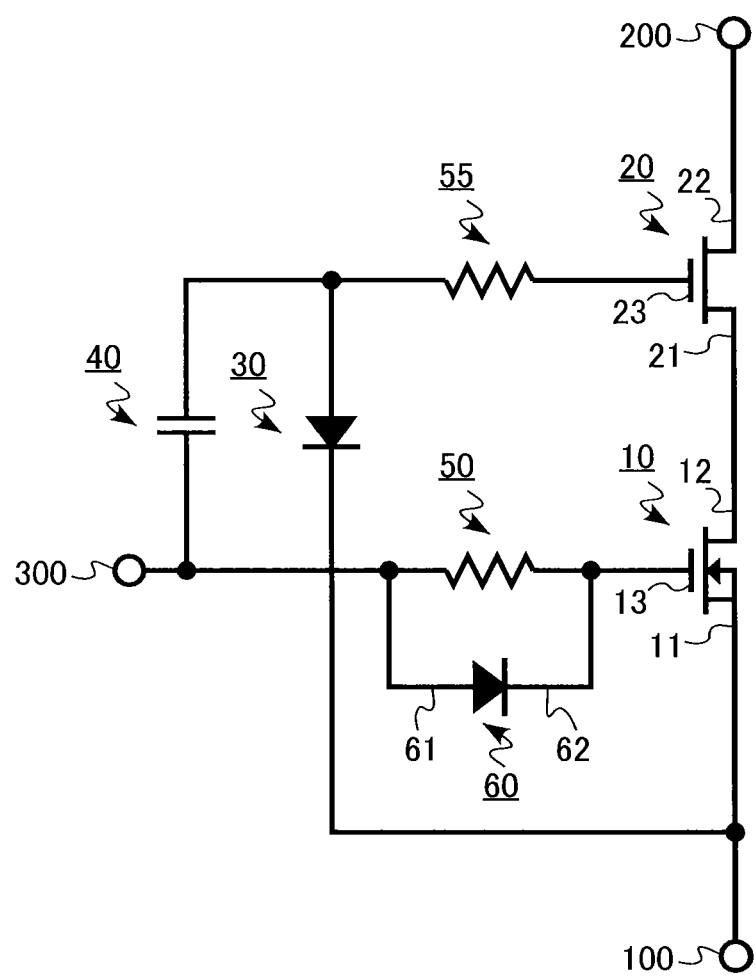
FIG. 8 is a circuit diagram of a semiconductor device of a sixth embodiment.

FIG. 8 is a circuit diagram of the semiconductor device of this embodiment.

The semiconductor device of this embodiment is provided with a third resistive element 55 between a capacitor 40 and a second gate 23.

As described above, in a power electronics circuit design, there is a case in which an operation speed of a transistor is required to be adjusted as measures against noise. In this embodiment, it is possible to delay propagation of a gate voltage applied to a gate terminal 300 to a second gate 23 by providing the third resistive element 55. The propagation of the gate voltage to a first gate 13 may be independently adjusted by resistance of a first resistive element 50. Therefore, it becomes possible to adjust the operation speed (switching speed) of the semiconductor device.

According to this embodiment, in addition to the effect of the fourth embodiment, it becomes possible to adjust the operation speed (switching speed) of the semiconductor device.

Seventh Embodiment

A semiconductor device of this embodiment is similar to that of the first embodiment except that a Schottky barrier diode including a third anode electrically connected to a first source and a third cathode electrically connected to a first drain and a second source having a forward drop voltage lower than a forward drop voltage of a parasitic body diode of a normally-off transistor is further provided. Therefore, the description of contents overlapped with those of the first embodiment is not repeated.

Figure 9:
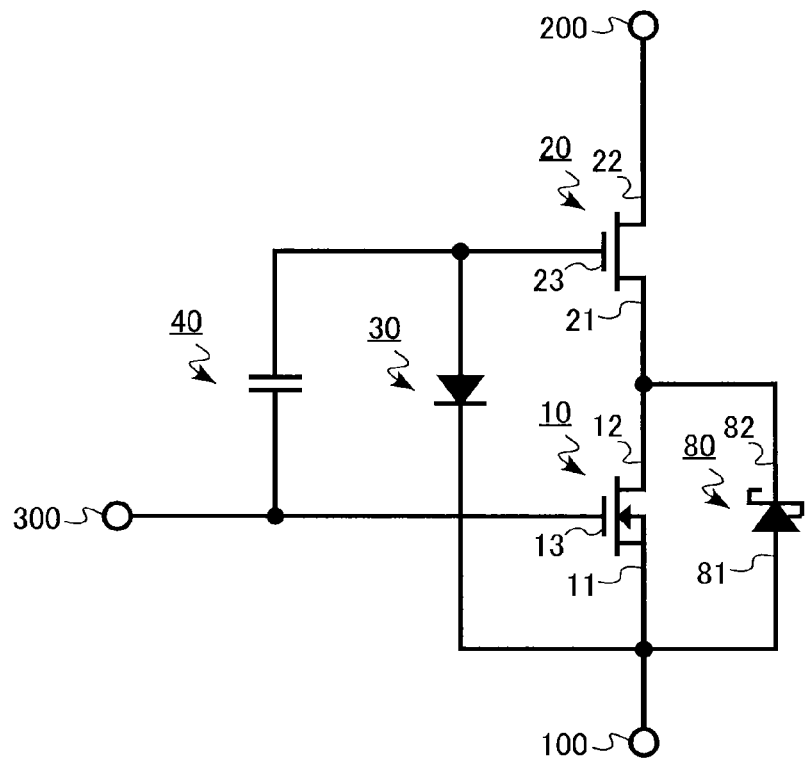
FIG. 9 is a circuit diagram of a semiconductor device of a seventh embodiment.

FIG. 9 is a circuit diagram of the semiconductor device of this embodiment. In the semiconductor device of this embodiment, a Schottky barrier diode 80 is provided in parallel with a normally-off transistor 10.

The Schottky barrier diode 80 is provided with a third anode 81 and a third cathode 82. The third anode 81 is electrically connected to a first source 11. The third cathode 82 is electrically connected to a first drain 12 and a second source 21.

A forward drop voltage (Vf) of the Schottky barrier diode 80 is lower than a forward drop voltage (Vf) of a parasitic body diode (not illustrated) of the normally-off transistor.

When the Schottky barrier diode 80 is not provided, a current flows through the parasitic body diode of the normally-off transistor 10 in a reflux mode in which a voltage of a source terminal 100 is a positive voltage relative to a drain terminal 200. In this embodiment, the Schottky barrier diode 80 having the forward drop voltage (Vf) lower than the forward drop voltage (Vf) of the parasitic body diode of the normally-off transistor 10 is provided. According to this, the current flows through the Schottky barrier diode 80 in the reflux mode.

Different from a PiN diode, the Schottky barrier diode operates by using only a majority carrier. Therefore, this is excellent in recovery property as compared to the PiN diode. Therefore, in this embodiment, in addition to the effect of the first embodiment, it becomes possible to improve the recovery property in the reflux mode. Since the forward drop voltage (Vf) is small, it is possible to decrease conduction loss and switching loss in the reflux mode. Application of an overvoltage due to a surge and the like at a connection is inhibited by a parasitic capacitance of the Schottky barrier diode 80. It is possible to release a charge from the connection by a leakage current of the Schottky barrier diode 80, so that the application of the overvoltage at the connection is inhibited. Therefore, the semiconductor device with further improved reliability is realized. An increase in voltage of the first drain 12 of the normally-off transistor 10 is also inhibited by the leakage current of the Schottky barrier diode 80. Therefore, stable operation is also realized.

Meanwhile, since the Schottky barrier diode is not an avalanche-proof Schottky barrier diode, a withstand voltage of the Schottky barrier diode 80 is desirably higher than an avalanche breakdown voltage of the normally-off transistor 10.

Eighth Embodiment

A semiconductor device of this embodiment is similar to that of the first embodiment except that a Zener diode including a fourth anode electrically connected to a first source and a fourth cathode electrically connected to a first drain and a second source having a Zener voltage lower than a withstand voltage between the second source and a second gate of a normally-on transistor and lower than an avalanche breakdown voltage of a normally-off transistor is further provided. Therefore, the description of contents overlapped with those of the first embodiment is not repeated.

Figure 10:
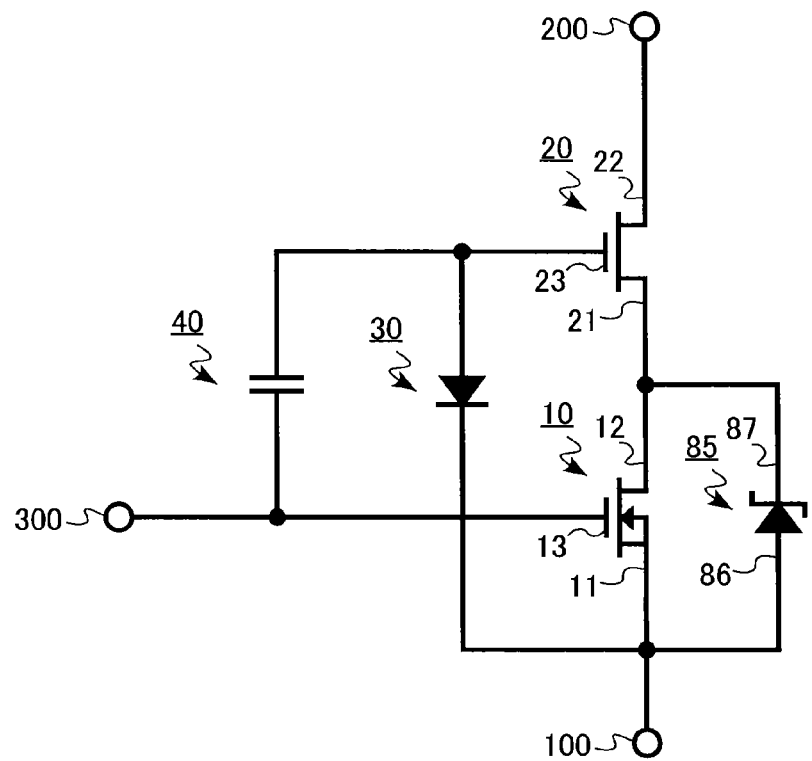
FIG. 10 is a circuit diagram of a semiconductor device of an eighth embodiment.

FIG. 10 is a circuit diagram of the semiconductor device of this embodiment. In the semiconductor device of this embodiment, a Zener diode 85 is provided in parallel with a normally-off transistor 10.

The Zener diode 85 includes a fourth anode 86 and a fourth cathode 87. The fourth anode 86 is electrically connected to a first source 11. The fourth cathode 87 is electrically connected to a first drain 12 and a second source 21.

The Zener voltage of the Zener diode 85 is set to be lower than the avalanche breakdown voltage of the normally-off transistor 10. The Zener voltage is set to be lower than a withstand voltage of a gate insulation film of a normally-on transistor 20. According to this, a withstand voltage between the first source 11 and the first drain 12 when the normally-off transistor 10 is turned off becomes lower than a withstand voltage between the second source 21 and the second gate 23 of the normally-on transistor 20.

In the semiconductor device of this embodiment, when an overvoltage due to a surge and the like is generated at a connection between the normally-off transistor 10 and the normally-on transistor 20, a charge is released to the Zener diode 85 to pass through a source terminal 100 when the overvoltage reaches the Zener voltage. Therefore, an increase in voltage at the connection is inhibited and an increase in leakage current of the gate insulation film of the normally-on transistor 20 and a break of the gate insulation film are prevented. A current collapse is also prevented. Therefore, reliability of the semiconductor device is improved.

The Zener voltage of the Zener diode 85 may be controlled with higher accuracy as compared to the avalanche breakdown voltage of the normally-off transistor 10. Therefore, in the semiconductor device of this embodiment, it becomes possible to inhibit the overvoltage at the connection in a more stable manner by using the Zener diode 85. Even when an unexpected high voltage such as noise is applied to the first drain 12 of the normally-off transistor 10, the charge may be released by the Zener diode 85, so that this also contributes to protect the normally-off transistor 10.

Ninth Embodiment

A semiconductor device of this embodiment is provided with all configurations of the first, third, fourth, fifth, seventh, and eighth embodiments. Therefore, the description of contents overlapped with those of the first, third, fourth, fifth, seventh, and eighth embodiments is not repeated.

Figure 11:
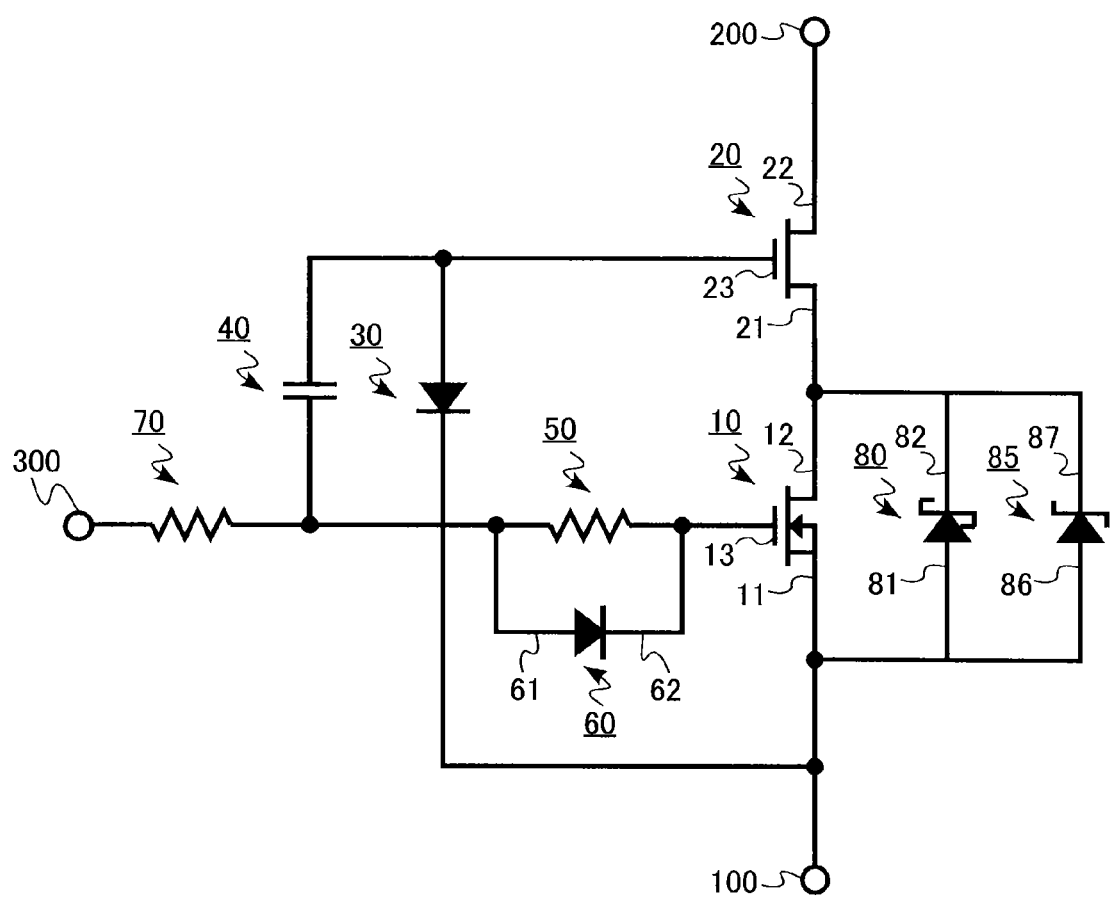
FIG. 11 is a circuit diagram of a semiconductor device of a ninth embodiment.

FIG. 11 is a circuit diagram of the semiconductor device of this embodiment. The semiconductor device of this embodiment is provided with all the configurations of the first, third, fourth, fifth, seventh, and eighth embodiments, so that an effect obtained by combining the effects of the embodiments is realized.

Tenth Embodiment

A semiconductor device of this embodiment is provided with a substrate, a source lead wire, a drain lead wire, and a gate lead wire. A normally-off transistor, a normally-on transistor, a capacitor, and a first diode are mounted on the substrate, the normally-off transistor and the normally-on transistor are arranged in this order from a side of the source lead wire to a side of the drain lead wire, the source lead wire is connected to a first source and a first cathode, and the drain lead wire is connected to a second drain.

This embodiment is obtained by embodying the circuit configuration of the ninth embodiment as a power module. Hereinafter, the description of contents overlapped with those of the ninth embodiment is not repeated.

Figure 12:
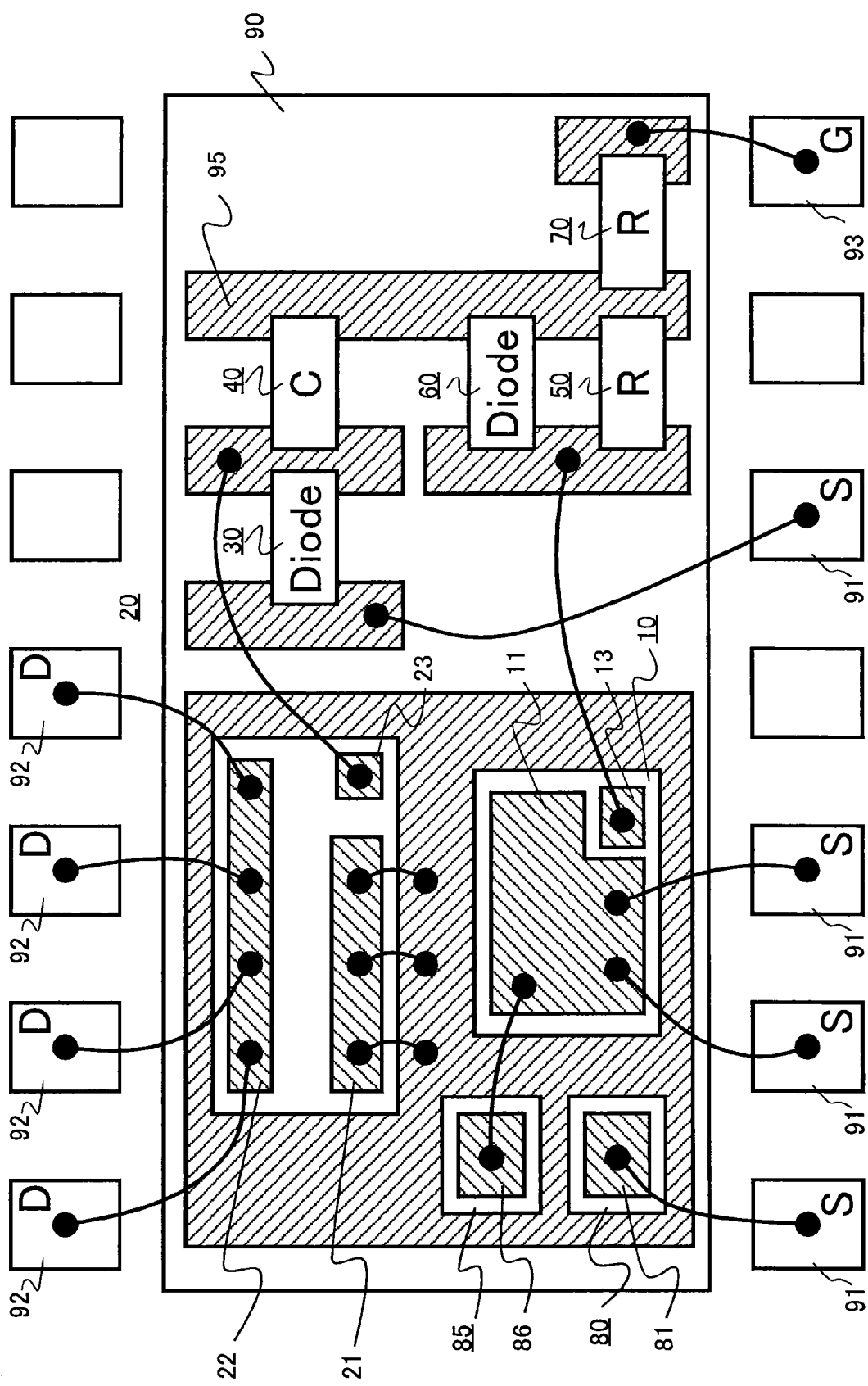
FIG. 12 is a top schematic view of a semiconductor device of a tenth embodiment.

FIG. 12 is a top schematic view of the semiconductor device of this embodiment.

The semiconductor device of this embodiment is provided with a substrate 90, a source lead wire 91, a drain lead wire 92, and a gate lead wire 93. The source lead wire 91, the drain lead wire 92, and the gate lead wire 93 correspond to a source terminal 100, a drain terminal 200, and a gate terminal 300, respectively.

A metal conductive material 95, for example, is present on at least a surface of the substrate 90. A normally-off transistor 10, a normally-on transistor 20, a Zener diode 85, and a Schottky barrier diode 80 are mounted on the substrate 90. Each of the normally-off transistor 10, the normally-on transistor 20, the Zener diode 85, and the Schottky barrier diode 80 is a semiconductor chip, for example, and is mounted on the conductive material 95 on the substrate with conductive paste, soldering and the like, for example.

A capacitor 40, a first diode 30, a first resistive element 50, a second resistive element 70, and a second diode 60 are mounted on the conductive material 95 through soldering on the substrate 90.

The Schottky barrier diode 80, the Zener diode 85, and the normally-on transistor 20 are arranged in this order from a side of the source lead wire 91 to a side of the drain lead wire 92. The normally-off transistor 10 and the normally-on transistor 20 are arranged in this order from the side of the source lead wire 91 to the side of the drain lead wire 92 on the substrate 90.

Then, the source lead wire 91 is connected to a third anode 81 and a first source 11 and the drain lead wire 92 is connected to a second drain 22. Each connection is performed by wire bonding, for example. A material such as copper (Cu) and aluminum (Al) is used, for example, in the wire bonding.

According to this embodiment, the normally-off transistor 10 and the normally-on transistor 20 are arranged in this order from the side of the source lead wire 91 to the side of the drain lead wire 92. According to this, a pathway through which an on-state current of the semiconductor device flows maybe shortened. This arrangement eliminates parasitic inductance of the pathway of the on-state current as far as possible to decrease conduction loss.

Also, by arranging the Schottky barrier diode 80 and the normally-on transistor 20 in this order from the side of the source lead wire 91 to the side of the drain lead wire 92, the pathway of the current flowing through the pathway from the source lead wire 91 through the Schottky barrier diode 80 and the normally-on transistor 20 to the drain lead wire 92 in the reflux mode may be shortened. Therefore, the conduction loss in the reflux mode may be decreased.

In the Schottky barrier diode, a leakage current has large temperature dependency. The normally-on transistor 20 being a GaN-based HEMT emits heat the most in the semiconductor device of this embodiment. Therefore, it is possible to increase a distance between the Schottky barrier diode 80 and the normally-on transistor 20 by arranging the Zener diode 85 between the Schottky barrier diode 80 and the normally-on transistor 20. Therefore, property fluctuation of the Schottky barrier diode 80 may be inhibited.

The Zener diode 85 which inhibits an overvoltage by a surge and the like at a connection is provided so as to be adjacent to the normally-off transistor 10 and the first source 11 and the fourth anode 86 are directly bonded. According to this, a pathway to release a charge from the connection is shortened and application of the overvoltage may be efficiently inhibited.

As described above, according to this embodiment, in addition to the effect of the ninth embodiment, the semiconductor device excellent in property may be realized by appropriately arranging and connecting each device.

Meanwhile, although a case in which all configurations of the first, third, fourth, fifth, seventh, and eighth embodiments are provided is herein described as an example, it is possible to select a necessary configuration from the third, fourth, fifth, seventh, and eighth embodiments to make a package.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a normally-off transistor having a first source electrically connected to a source terminal, a first drain, and a first gate electrically connected to a gate terminal;
   a normally-on transistor having a second source electrically connected to the first drain, a second drain electrically connected to a drain terminal, and a second gate;
   a capacitor having one end electrically connected to the gate terminal and the other end electrically connected to the second gate; and
   a first diode having a first anode electrically connected to the capacitor and the second gate and a first cathode electrically connected to the first source.

2. The device according to claim 1, wherein the normally-on transistor is a GaN-based HEMT.

3. The device according to claim 1, further comprising a first resistive element with one end electrically connected to the gate terminal and the capacitor and the other end electrically connected to the first gate.

4. The device according to claim 3, further comprising a second diode provided between the gate terminal and the first gate in parallel with the first resistive element, the second diode having a second anode connected to the gate terminal and a second cathode electrically connected to the first gate.

5. The device according to claim 3, further comprising a third resistive element having one end electrically connected to the capacitor and the other end electrically connected to the second gate.

6. The device according to claim 1, further comprising a second resistive element having one end electrically connected to the gate terminal and the other end electrically connected to the capacitor and the first gate.

7. The device according to claim 1, wherein a capacitance of the capacitor is 10 times or more as large as an input capacitance of the normally-on transistor.

8. The device according to claim 1, further comprising a Schottky barrier diode having a third anode electrically connected to the first source and a third cathode electrically connected to the first drain and the second source, the Schottky barrier diode having a forward drop voltage lower than a forward drop voltage of a parasitic body diode of the normally-off transistor.

9. The device according to claim 1, further comprising a Zener diode having a fourth anode electrically connected to the first source and a fourth cathode electrically connected to the first drain and the second source, the Zener diode having a Zener voltage lower than a withstand voltage between the second source and the second gate of the normally-on transistor and lower than an avalanche breakdown voltage of the normally-off transistor.

10. The device according to claim 1, wherein the normally-off transistor is a Si-vertical MOSFET.

11. The device according to claim 1, further comprising
a substrate, a source lead wire, a drain lead wire, and a gate lead wire, wherein
the normally-off transistor, the normally-on transistor, the capacitor, and the first diode are mounted on the substrate,
the normally-off transistor and the normally-on transistor are arranged in this order from a side of the source lead wire to a side of the drain lead wire,
the source lead wire is connected to the first source and the first cathode, and
the drain lead wire is connected to the second drain.

* * * * *